US007167215B2

(12) United States Patent
Markman et al.

(10) Patent No.: US 7,167,215 B2
(45) Date of Patent: Jan. 23, 2007

(54) GAIN CONTROL FOR A HIGH DEFINITION TELEVISION DEMODULATOR

(75) Inventors: Ivonete Markman, Carmel, IN (US); Gabriel Alfred Edde, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 625 days.

(21) Appl. No.: 10/474,910

(22) PCT Filed: Apr. 16, 2002

(86) PCT No.: PCT/US02/11810

§ 371 (c)(1), (2), (4) Date: Oct. 15, 2003

(87) PCT Pub. No.: WO02/085006

PCT Pub. Date: Oct. 24, 2002

(65) Prior Publication Data

US 2004/0109092 A1 Jun. 10, 2004

Related U.S. Application Data

(60) Provisional application No. 60/284,212, filed on Apr. 16, 2001.

(51) Int. Cl.
*H04N 5/455* (2006.01)

(52) U.S. Cl. ...................................................... 348/726

(58) Field of Classification Search ..................... None
See application file for complete search history.

(56) References Cited

U.S. PATENT DOCUMENTS 4,885,546 A * 12/1989 Araki ........................ 329/341
5,570,137 A * 10/1996 Goeckler .................... 348/726
5,694,079 A * 12/1997 Allpress et al. ............. 329/327
5,838,395 A * 11/1998 Brilka ........................ 348/726
6,356,598 B1 * 3/2002 Wang ......................... 375/321
6,707,861 B1 * 3/2004 Stewart ...................... 375/321
6,996,193 B2 * 2/2006 Yamagata et al. .......... 375/329
2003/0197810 A1 * 10/2003 Jaffe .......................... 348/726
2004/0109092 A1 * 6/2004 Markman et al. ........... 348/726
2004/0223086 A1 * 11/2004 Jaffe .......................... 348/726

FOREIGN PATENT DOCUMENTS

WO 98/15120 4/1998
WO 99/23815 5/1999

* cited by examiner

*Primary Examiner*—Paulos M. Natnael
(74) *Attorney, Agent, or Firm*—Joseph J. Laks; Ronald H. Kurdyla

(57) ABSTRACT

A demodulator for a high definition television receiver includes a first circuit element which receives a signal, and is operative in a first arrangement to produce an output signal having a first dynamic range, and operative in a second arrangement to produce an output signal having a second dynamic range different from the first dynamic range. A second circuit element is arranged for optimally processing a signal having a substantially predetermined fixed dynamic range. A gain control circuit is coupled between the first and second circuit elements, and produces a signal having the substantially predetermined fixed dynamic range.

17 Claims, 3 Drawing Sheets

System

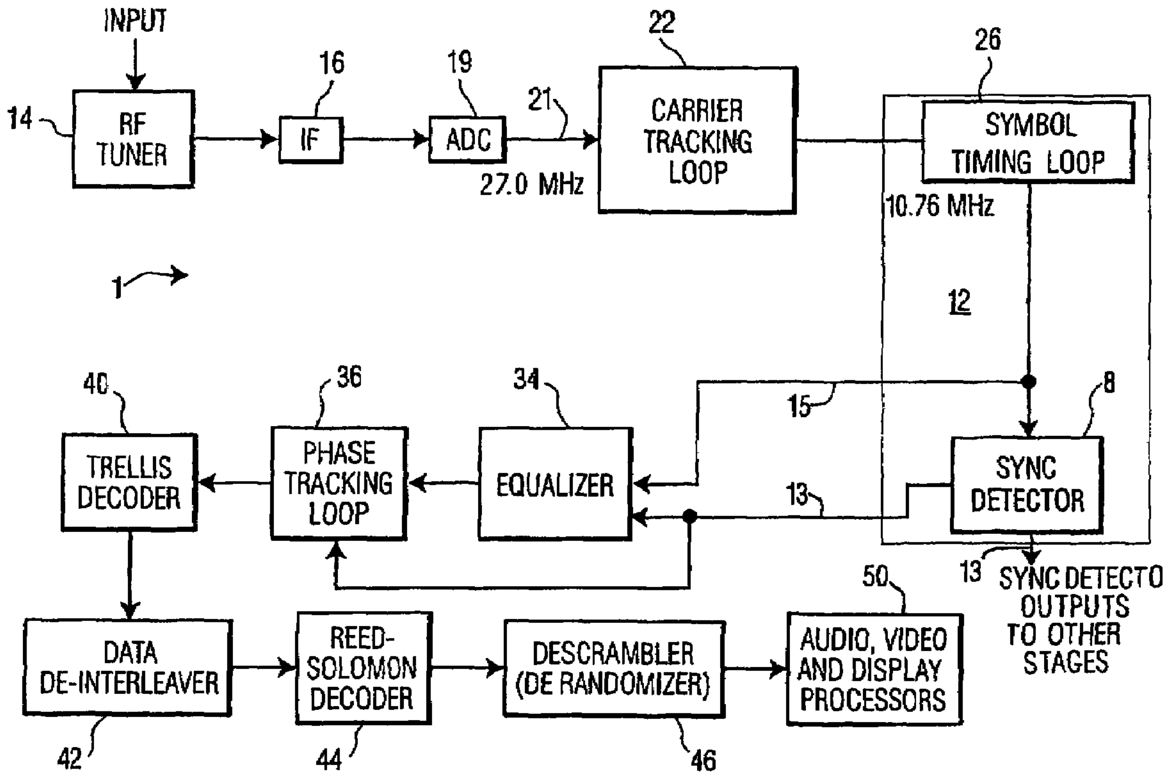
Fig. 1 - System

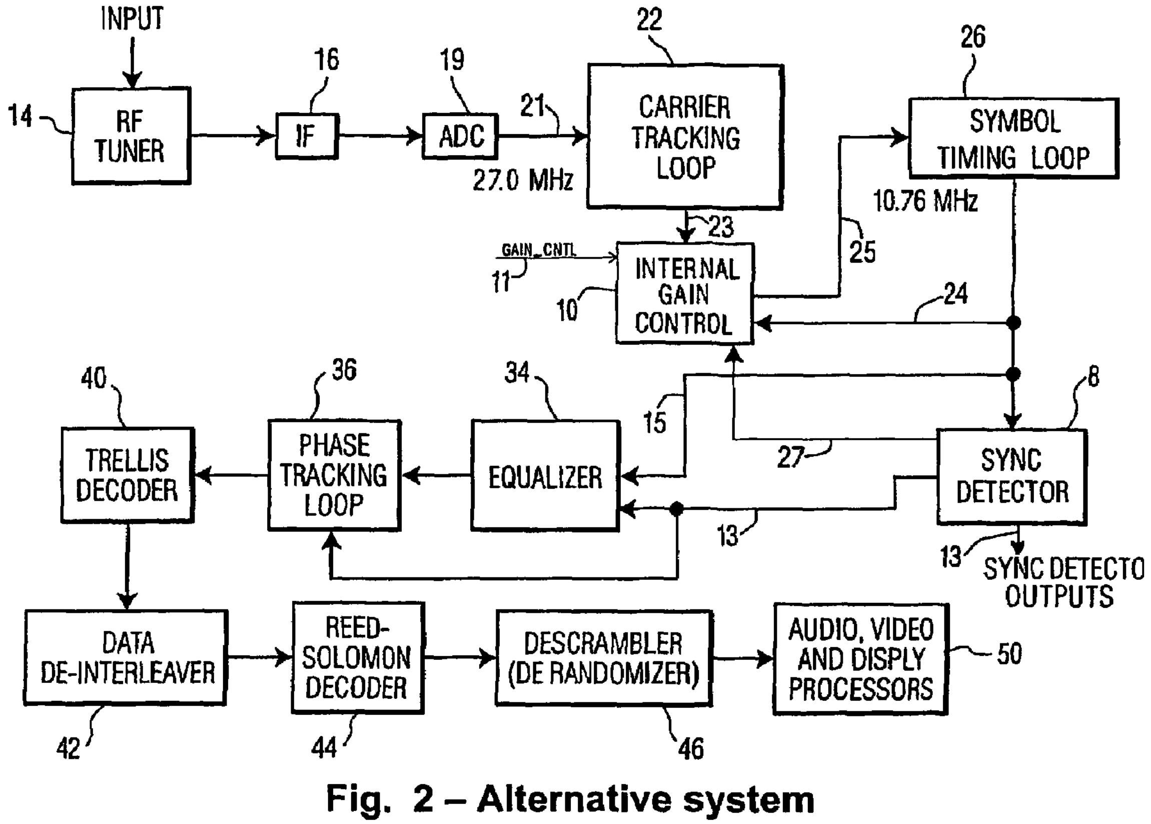
Fig. 2 – Alternative system

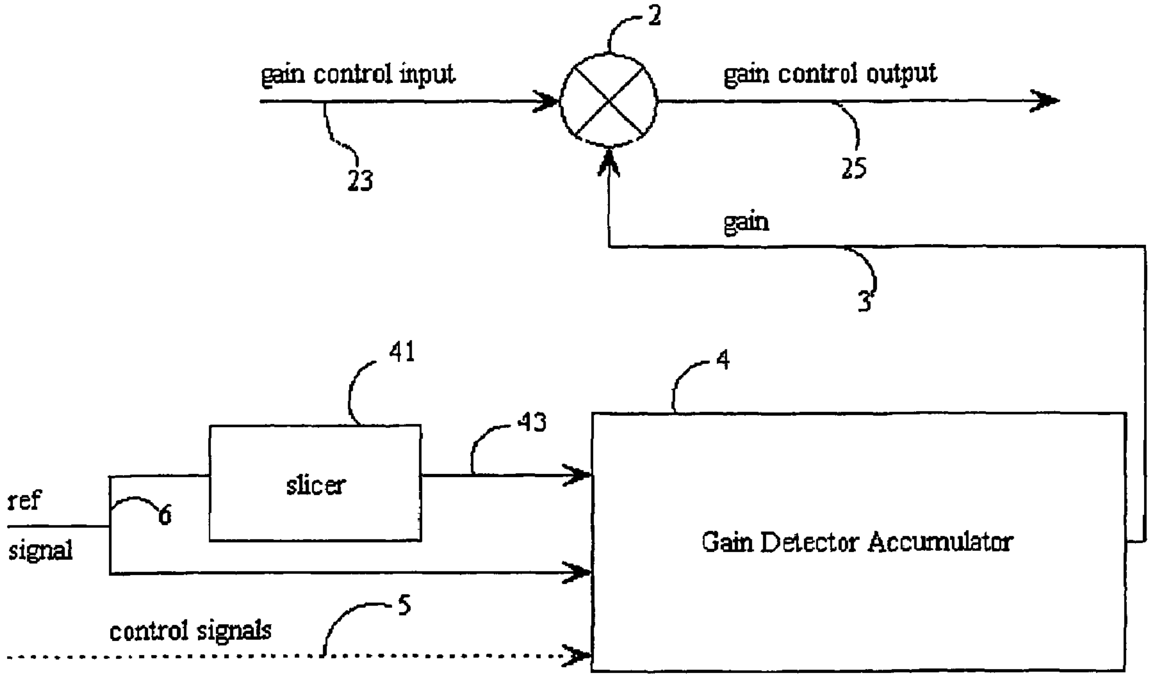
Fig. 3 - Detail

GAIN CONTROL FOR A HIGH DEFINITION TELEVISION DEMODULATOR

This application claims the benefit under 35 U.S.C. § 365 of International Application PCT/US02/11810 filed Apr. 16, 2002, which claims the benefit of U.S. Provisional Application No. 60/284,212 filed Apr. 16, 2001.

FIELD OF THE INVENTION

The present invention relates generally to digital signal detection and demodulation, and more specifically to digital demodulators in which the carrier tracking loop precedes the symbol timing loop.

BACKGROUND OF THE INVENTION

The High definition television (HDTV) broadcast standard adopted by the Advanced Television Systems Committee (ATSC) in the U.S. and originally proposed by the "Grand Alliance" of several television manufacturers and research laboratories is described in the "ATSC Digital Television Standard", Document A/53 published on Sep. 16, 1995. This document sets forth all the requirements regarding HDTV signal characteristics. In particular, the ATSC-HDTV signals require a vestigial sideband modulation format.

Vestigial sideband (VSB) modulation is a well-known modulation method for digitally transmitting data such as HDTV signals. Recovery of data by a digital receiver from the transmitted ATSC-VSB signal, which contains the digital video, audio and related information, inherently requires the implementation of several functions, including but not limited to: timing recovery for symbol synchronization, carrier recovery or tracking, and equalization.

Timing recovery is the process by which the receiver clock (timebase) is synchronized to the transmitter clock by decoding the timing signal which is embedded in the transmitted VSB signal. The two quantities which the receiver must determine in order to achieve symbol synchronization are the sampling frequency and the sampling phase. The sampling frequency is typically specified but oscillator drift will introduce deviations from the specified symbol rate. The sampling phase is the correct time within a symbol period during which to take a symbol representative data sample.

Real world symbol pulse shapes have a peak in the center of the symbol period. Sampling the symbol at this peak will produce the best signal-to-noise ratio (SNR) and will ideally eliminate intersymbol interference (ISI) associated with the pulse shape. An example of a symbol timing recovery loop (STL) is disclosed in U.S. Pat. No. 5,943,369, entitled TIMING RECOVERY SYSTEM FOR A DIGITAL SIGNAL PROCESSOR, issued Aug. 24, 1999 to Knutson et al. The accuracy of the recovered timing signal is substantially equivalent to the accuracy of the transmitted VSB timing signal.

Carrier tracking addresses the problem of frequency offset between the transmitter and receiver oscillators either intrinsic to their design or due to drifts, causing a drift of the sinusoidal carrier signal. At the transmitter, the carrier signal is multiplied by a data representative signal in order to modulate the carrier signal to a passband radio frequency (RF) center frequency. At the receiver the passband RF signal is demodulated to a lower intermediate frequency (IF) or directly to baseband by being multiplied by a sinusoid generated by the local oscillator (LO). Ideally the LO and transmitter oscillator frequencies will match, but in practice any difference will result in the demodulated signal being not at but near the IF center frequency or baseband with some frequency offset. The offset will cause the received signal constellation to rotate and forbid signal recovery. This "spinning" effect must be removed before accurate symbol decisions can be made. The purpose of the carrier tracking loop (CTL) is to remove this frequency offset and demodulate the signal down to baseband (from the original IF or near baseband frequency), so that the received signal can be processed accurately directly at baseband. In the case of the VSB transmitted signal, by frequency shifting the signal down to baseband accurately the full signal spectrum can be recovered from the RF spectrum, since only a portion of the original spectrum is actually transmitted.

Equalization is a signal processing technique that attempts to correct for linear distortions in the received signal, which appear in the form of ISI, mainly caused by channel impairments (e.g., multipath propagation in the terrestrial broadcast channel) or by filtering in the receiver or transmitter.

Practical receivers maximize the SNR at the receiver by using a technique known as matched filtering. A receiver employing such a technique filters the received signal with a filter whose shape is "matched" to the transmitted signal's pulse shape. The output of the filter is then sampled at times nT; where T is the symbol time interval. The matched filter's pulse shape is a time-reversed version of the transmitted pulse shape. Such processing has two advantages. One advantage is that typical pulse shapes have a low pass response. By filtering the received signal with a low pass filter, the frequencies containing the data signal are passed while the remaining higher frequencies, containing only noise, are attenuated. Matched filtering thus limits the amount of the RF spectrum that must be processed by subsequent stages of the receiver. A second advantage is that a matched filter essentially correlates the received signal with the transmitted pulse shape over the time period T when the symbol is present.

The ideal signal pulse shape should have a limited bandwidth and zero ISI. One ideal pulse shape that meets these requirements is a time domain sinc pulse. All pulses of limited bandwidth, like the sinc pulse, are infinite in time duration. Practical implementations require that these pulses, or specifically the filters that create these pulses, be truncated to a finite length. The pulse or filter length is chosen according to a specified level of reliability. This reliability is associated with the amount of ISI in the signal, which has to be kept to a minimum. The spectrum of the sinc pulse has the shape of a rectangle, which implies a sharp discontinuity in the frequency domain. In order to restrict the amount of ISI, the length of the truncated pulse must be long. One pulse shape that has properties similar to the sinc pulse but without the frequency domain discontinuities is the raised cosine pulse. Because of its smoother spectrum, it is easier to truncate such pulses in the time domain. The most popular pulse shape used in practical communications systems is the root raised cosine pulse, which is formed by taking the square root of the spectrum of a raised cosine pulse. This pulse shape filter is used in both the transmitter and the receiver in order to split the spectral characteristics of the raised cosine pulse equally between the transmitter and the receiver. By cascading two root raised cosine filters together (one filter in the transmitter and the other matched filter in the receiver), the root raised cosine pulse spectrum is squared, thus creating a net system response of the desired raised cosine pulse. The output of the matched filter at the receiver is then sampled at symbol times nT.

A typical HDTV receiver demodulating scheme is disclosed in U.S. Pat. No. 6,233,295 entitled SEGMENT SYNC RECOVERY NETWORK FOR AN HDTV RECEIVER issued on May 15, 2001 to Wang. The disclosed demodulator includes an analog to digital (A/D) converter sampling at 21.52 MHz, a carrier tracking loop (CTL) operating at 21.52 MHz, followed by a symbol timing loop (STL) producing symbol samples at 10.76 MHz, followed by a sync detector, equalizer and phase tracker, all operating at the symbol rate of 10.76 MHz.

According to the ATSC-HDTV standard the IF input to the demodulator is a root raised cosine filtered signal (filtered in the transmitter), which should be matched by a similar root raised cosine filter in the receiver in order to avoid linear distortion and ISI due to the pulse shape. The receiver matched filter can be placed prior to the A/D as an analog filter, or before the CTL as a digital filter. However, the matched filter may also be placed after the CTL or even after the STL as a digital filter. In fact, because the equalizer is a digital filter, in theory, it can provide both channel equalization and matched filtering. In these cases, the signal processed by the CTL and the STL will not have been matched filtered, if both functions precede the equalizer.

Therefore, in the design of a general purpose HDTV demodulator subsystem, possibly in the form of an integrated circuit chip, several possibilities must be accommodated. The CTL input signal will be rotating in phase and the input signal may be either matched, i.e. fully raised cosine filtered by a preceding root raised cosine filter; or unmatched, i.e. the matching root raised cosine filter following the CTL. This along with the placement of the CTL prior to the STL implies that the CTL signal level may be up to 1.7 (matched case) or 2.0 (unmatched case) times the 8-VSB slicer levels. This need for a higher dynamic range in the CTL should be taken into consideration, otherwise, this condition can result in overflow in the CTL, which introduces severe nonlinearities in the demodulation process.

A demodulator design is desirable, which can compensate for the various possible placements for the receiver matching filter, as well as for different signal dynamic ranges in different demodulator blocks.

BRIEF SUMMARY OF THE INVENTION

In accordance with the principles of the present invention, a demodulator for a high definition television receiver includes a first circuit element which receives a signal, and is operative in a first arrangement to produce an output signal having a first dynamic range, and operative in a second arrangement to produce an output signal having a second dynamic range different from the first dynamic range. A second circuit element is arranged for optimally processing a signal having a substantially predetermined fixed dynamic range. A gain control circuit is coupled between the first and second circuit elements, and produces a signal having the substantially predetermined fixed dynamic range.

In such a system the problem of data overflow in a demodulator utilizing a carrier tracking loop is addressed by including a variable gain control between the carrier tracking loop and the symbol timing loop in order to accommodate both matched and unmatched filter design alternatives as well as to reduce carrier tracking loop hardware. In order to optimize the signal transition from the carrier tracking loop to the symbol timing loop, either a switchable gain control or an adaptive gain control may be placed between the two stages. Such a demodulator can be included in any digital demodulator design where the CTL precedes the STL (and other demodulator functions).

BRIEF DESCRIPTION OF THE DRAWING

In the drawing:

FIG. 1 is a block diagram of a high definition television (HDTV) receiver;

FIG. 2 is a block diagram of an HDTV receiver utilizing a fixed gain control in accordance with the principles of the present invention; and FIG. 3 is a block diagram of an adaptive gain control circuit suitable for use with the HDTV receiver depicted in FIG. 1.

DETAILED DESCRIPTION OF THE INVENTION

FIG. 1 is a block diagram of a high definition television receiver 1 which selects the desired RF input signal by means of RF tuner 14. The RF tuner 14 sends the selected signal to an IF processor 16 which produces an IF passband output signal. The received signal is a carrier suppressed VSB modulated signal (8 or 16 levels) as adopted for use in HDTV systems in the United States. Such a VSB signal carries successive symbols represented by a one-dimensional data symbol constellation in which only the real axis contains quantized data to be recovered by the receiver.

The passband IF output signal from processor 16 is converted into an oversampled digital datastream by an analog to digital (A/D) converter 19, which samples the analog signal at a frequency of, say, 27 MHz. A reference pilot carrier signal is embedded in the received VSB datastream, and this carrier is recovered by the phase locked carrier tracking loop (CTL) 22, which also operates at the same sample rate of 27 MHz. The purpose of the carrier tracking loop is to remove the frequency offset caused by differences between the transmitter oscillator and the receiver local oscillator so that the signal is accurately translated to, and can be processed directly at, baseband. The CTL produces an output real, or in-phase (I) demodulated datastream.

As described above, the A/D converter 19 oversamples the 10.76 million symbols/second input VSB datastream with a 27 MHz sampling clock, or about 2.5 times the received symbol rate, thereby providing at least two samples per symbol. The use of at least two samples per symbol sampling, rather than one sample per symbol, produces advantages in subsequent signal processing functions.

Following the A/D converter 19 and CTL 22 is a field and segment synchronization (sync) and symbol clock recovery circuit 12, which includes the symbol timing loop (STL) 26 and the sync detector 8. The STL 26 is a feedback loop much like the CTL 22. The STL 26 regenerates a properly phased 10.76 MHz clock signal, which is used to recover the symbol stream from the sampled data stream. The symbol stream is then processed by subsequent stages such as the sync detector 8, the equalizer 34 and the phase tracking loop 36. The sync detector 8 detects the field and segment synchronization signals by correlation and provides this information to all subsequent receiver blocks for synchronization purposes.

Some prior art HDTV receivers use the detected synchronization signal as the basis for symbol timing recovery. Other HDTV receivers utilize timing recovery techniques such as decision directed or band edge timing. Both techniques can be employed simultaneously, such as the Mueller & Muller decision directed algorithm, along with the Gardner band edge timing recovery algorithm. The present invention may be advantageously used with any such symbol timing recovery scheme.

After leaving the clock recovery circuit 12, the signal is adaptively equalized by a channel equalizer 34, which may operate in a combination of blind, training and decision directed modes. Equalizer 34 may be of the type described in the ATSC HDTV System Specification and in an article by W. Bretl et al., entitled "VSB Modem Subsystem Design for Grand Alliance Digital Television Receivers", IEEE Transactions on Consumer Electronics, August 1995. Equalizer 34 may also be of the type described by Shiue et al. in U.S. Pat. No. 5,712,873, issued on Jan. 27, 1998 and entitled MULTI-MODE EQUALIZER IN A DIGITAL VIDEO SIGNAL PROCESSING SYSTEM. The equalizer 34 corrects for channel distortions, but phase noise may randomly rotate the symbol constellation, and the amplitude of the equalized signal may vary. Phase tracking network 36 removes the residual phase and gain noise in the output signal from equalizer 34, including phase noise which has not been removed by the preceding CTL 22 in response to the pilot carrier signal. The phase corrected signal is then trellis decoded by decoder 40, de-interleaved by unit 42, Reed-Solomon error corrected by decoder 44, and descrambled by descrambler 46. After the foregoing processing steps, the decoded datastream is subjected to audio, video and display processing by unit 50.

RF tuner 14, IF processor 16, sync detector 8, equalizer 34, phase tracking loop 36, trellis decoder 40, de-interleaver 42, Reed-Solomon decoder 44 and descrambler 46 may employ circuits of the type described in the ATSC HDTV System Specification of Apr. 4, 1994, and in the Bretl, et al., article previously mentioned. The STL 26 may be any known timing recovery network. Circuits for performing the functions of A/D converter 19 and processors 50 are well known.

The sync detector 8 is a conventional sync detector which detects both segment and field syncs. The sync detector 8 includes an output terminal 13 which produces two synchronization signals (segment and field) indicating the presence of the corresponding synchronization signal in the data stream. The HDTV VSB transmission system conveys data with a prescribed data frame format. Each data frame includes two fields with each field including 313 segments of 832 multilevel symbols. The first segment of each field is referred to as a field sync segment and the remaining 312 segments are referred to as data segments. Each data segment includes a four symbol segment sync character. Each field sync segment includes the four symbol segment sync character followed by a field sync component comprising a predetermined 511 symbol pseudorandom number (PN) sequence and three predetermined 63 symbol PN sequences, the middle one of which is inverted in successive fields. A VSB mode control signal (defining the VSB symbol constellation size, i.e., 8-VSB or 16-VSB) follows the last 63 PN sequence, which is followed by 96 reserved symbols and 12 symbols copied from the previous field.

As each sync signal is detected in the datastream, sync detector 8 generates a sync output signal 13, which is the equivalent of a sync enable pulse for the respective sync component. The sync output signal 13 is HIGH whenever the sync signals appear in the datastream and otherwise remain LOW. The sync output signal 13 (or a signal derived from it) is also used in some form by the subsequent processing units 34, 36, 40, 42, 44 and 46.

As stated earlier, a matched filter may be placed prior to or after the A/D converter 19, after the CTL 22 or after the STL 26. However, in the demodulator illustrated in FIG. 1, the matched filter is not located prior to the equalizer 34, and thus is not illustrated. Instead, the equalizer 34 performs the matched filtering function. This placement of the matched filter creates additional linear distortion in the CTL and STL.

The output signal 15 produced by the STL 26 and the output signal 13 produced by the sync detector 8 are both inputs to the equalizer 34.

Although not depicted in FIG. 1, a slicer function is also present inside the equalizer 34 and clock recovery circuit 12. At each symbol time, the slicer selects, from a programmed look up table, a data symbol corresponding to the point in the symbol constellation that is closest to the input symbol sample as its decision. That is, the slicer selects as its decision the symbol in its alphabet which is closest in Euclidean distance to the input symbol sample. More specifically, the slicer expects an input signal at predetermined signal points along the real axis corresponding to the transmitted symbols.

The CTL input signal 21 is rotating in phase and may be matched (i.e. a fully raised cosine filtered signal) or unmatched (i.e. only a root raised cosine filtered signal, as is illustrated in FIG. 1), meaning that the CTL input signal may have a level up to 1.7 (matched case) or 2.0 (unmatched case) times the level expected by the 8-VSB slicer. Additional information regarding carrier recovery, slicing and derotating operations may be found in the text by Lee and Messerschmidt entitled DIGITAL COMMUNICATION published by Kluwer Academic Publishers, Boston, Mass., U.S.A. In order to avoid nonlinearities in the demodulation process introduced by data overflow in the CTL 22, the CTL 22 must have a higher dynamic range than the demodulator stages 8, 34, 36, etc. which follow the STL 26. This requires a higher dynamic range in the A/D 19 as well.

However, in order to save in A/D and CTL hardware, it is desirable to keep the same dynamic range for the entire demodulator, e.g., 10-bit samples in the data stream. If the same dynamic range is used for the different demodulator blocks (19, 22, 26, 8, 34 and 36), and considering that the CTL signal dynamic range is 1.7 to 2.0 greater than the dynamic range of the symbol stream past the STL 26, it means that the blocks past the STL 26 will utilize a smaller dynamic range than the hardware allows. The smaller the signal dynamic range is, the more critical quantization noise becomes. Quantization noise is the difference between the actual value of a signal at the sampling time and the nearest quantization interval value. One source of quantization noise is created by the slicer, when it approximates an input sample by its closest slicer level. In addition, the STL may be dependent on the slicer levels, therefore achieving optimum performance when the signal levels are close to the slicer levels. Also, the equalizer convergence speed increases when the signal levels are close to the slicer levels and the equalizer does not need to provide gain control in addition to correcting for linear distortion. Although in theory the equalizer can provide some level of gain control, it runs the risk of false convergence when the signal level at its input is far away from the slicer levels. For all the reasons given above, the most desirable demodulator solution requires: use of the same dynamic range in entire demodulator, use of the full hardware dynamic range throughout the demodulator, and STR output and equalizer input signal levels close to the slicer levels. The present invention addresses the internal gain imbalance between CTL signal output and STL signal output, as well as the different possibilities of signal dynamic range available at the CTL input due to different placements of the matched filter.

Due to different design possibilities, such as whether the processed IF signal will be matched or unmatched, and in order to optimize the connection between the CTL 22 and the STL 26, a first embodiment of the present invention couples a switchable fixed gain control between the CTL 22 and the STL 26.

Referring to FIG. 2, an HDTV receiver including an internal gain control 10 is shown. The gain control 10 may be placed as shown at the output of the CTL 22, or alternatively it may be placed after the output of an interpolator (not shown), which is typically one of the internal components of STL 26. The interpolator is able to generate signal samples temporally in between the 27 MHz samples actually taken by the A/D converter 19. That is, it interpolates between the 27 MHz samples to generate the 10.76 MHz symbol time samples, and in a preferred embodiment to generate further samples at times halfway between the symbol times. By generating these intermediate samples as needed, the interpolator allows the STL 26 to adjust the effective sampling frequency and phase.

The internal gain control 10 receives the output of CTL 22 along signal path 23. The CTL output signal level is adjusted prior to entering STL 26 along signal path 25. The absolute gain of the gain control 10 is controlled by the gain_cntl signal 11, as illustrated in Table I, below. One skilled in the art will understand that, internally, the internal gain control 10 may be comprised of a plurality of fixed gain amplifiers respectively having the gains specified in Table I, and that the gain_cntl signal may control switching circuitry to select the desired one of the fixed gain amplifiers to provide the gain adjusted output signal along signal path 25. The gain_cntl control signal may be supplied by circuitry outside of the demodulator.

TABLE 1

| Gain_cntl | Gain |
|---|---|
| 0 | 1.0 |
| 1 | 1.5 |
| 2 | 1.75 |
| 3 | 2.0 |

In FIG. 3, an alternative adaptive gain control embodiment of the present invention is illustrated. The adaptive gain control loop in FIG. 3 is an automatic gain control loop having a relatively low bandwidth (on the order of a few kHz or less) so as to not interfere with other loops in the HDTV receiver 1. The gain control input signal 23 is derived from the CTL 22 (FIG. 2). Gain control input signal 23 is processed by adaptive gain control 2, which has an output signal 25 that is coupled to the input to STL 26. The attenuation provided by gain control 2 is adjusted by output signal 3 of detector 4.

Gain detector and accumulator 4 is a detector and accumulator responsive to three input signals: control signal(s) 5, the reference signal 6 and the sliced reference signal 43, representing ideal symbol representative signals, from the slicer 41. Reference signal 6 may be the STL output signal 15, in which case the entire datastream or sequence is evaluated. Alternatively, the reference signal 6 may be gated by sync output signal 13, in which case only the field or segment sync signals would be evaluated after being identified within the datastream by the sync detector 8. The control signal(s) 5 are symbol clock enable pulses if the clock rate is higher than the symbol rate. Alternatively, the control signals 5 are segment sync detector output signals and/or field sync detector output signals 13. The segment or field sync detector output signals 13 are enable signals which indicate the presence of segment or field sync, respectively, within the datastream, as described above. For example, the segment sync detector output goes HIGH when the four segment sync symbols appear in the datastream; otherwise the output signal 13 is LOW.

The gain detector & accumulator 4 may be implemented according to either of the following formulas:

$$y=x^*(xs-x) \text{ or}$$

$$y=\text{sign }(x)^*(xs-x)$$

where y is the output signal 3 of detector 4;

x is the reference signal 6;

xs is the slicer 41 sliced reference signal 43; and sign(.) is the sign function.

The gain detector and accumulator 4 may further accumulate the y values derived from either of the above equations, and use the accumulation as the gain control signal 3.

What is claimed is:

1. A demodulator for a high definition television receiver, comprising:

a first circuit element, for receiving a signal, and operative in a first arrangement to produce an output signal having a first dynamic range, and operative in a second arrangement to produce an output signal having a second, dynamic range different from the first dynamic range;

a second circuit element arranged for optimally processing a signal having a substantially predetermined fixed dynamic range; and a gain control circuit, coupled between the first and second circuit elements, for producing a signal having the substantially predetermined fixed dynamic range.

2. The demodulator of claim 1 wherein the first and second dynamic ranges are wider than the predetermined fixed dynamic range.

3. The demodulator of claim 1 wherein:

the first circuit element comprises a carrier tracking loop for processing the received signal to generate a baseband signal;

the first arrangement further comprises a matched filter coupled to the carrier tracking loop and the second arrangement does not include a matched filter preceding the carrier tracking loop; and the second circuit element comprises a decision-directed circuit element, wherein decisions are made based on decision points having predetermined fixed signal levels.

4. The demodulator of claim 1 wherein the gain control circuit is responsive to a gain control signal exhibiting a switchable fixed gain.

5. The demodulator of claim 4 wherein the gain control circuit operates according to the table:

| Gain control signal | Gain |
|---|---|
| 0 | 1.0 |
| 1 | 1.5 |
| 2 | 1.75 |
| 3 | 2.0. |

6. The demodulator of claim 4 wherein the gain control signal is supplied from outside the demodulator.

7. The demodulator of claim 1 wherein the gain control circuit comprises an adaptive gain control circuit, responsive to a reference signal from the second circuit element to adjust the gain.

8. The demodulator of claim 7 wherein the adaptive gain control circuit comprises a detector for generating gain adjustment signals responsive to the reference signal and adjusting the gain in response to the gain adjustment signals.

9. The demodulator of claim 8 wherein the adaptive gain control circuit further comprises an accumulator for accumulating gain adjustment signals and adjusting the gain in response to the accumulation.

10. The demodulator of claim 7 wherein:

the second circuit element comprises a symbol timing loop, for producing a sequence of symbol representative signals; and the adaptive gain control circuit is responsive to the sequence of symbol representative signals as the reference signal to adjust the gain.

11. The demodulator of claim 10 wherein:

the sequence of symbol representative signals is arranged in successive segments each containing a segment synchronization portion containing a fixed number of symbols; and the adaptive gain control circuit is responsive to all or part of the segment synchronization portion to adjust the gain.

12. The demodulator of claim 11 wherein:

the second circuit element further comprises a synchronization detector generating a segment synchronization signal having a first state during the segment synchronization portion and a second state otherwise; and the adaptive gain control circuit is responsive to the sequence of symbol representative signals and the segment synchronization signal, to adjust the gain in response to the segment synchronization portion.

13. The demodulator of claim 10 wherein:

the sequence of symbol representative signals is arranged in successive segments, and further arranged into fields, each containing a field synchronization portion containing a fixed number of segments; and the adaptive gain control circuit is responsive to all or part of the field synchronization portion to adjust the gain.

14. The demodulator of claim 13 wherein:

the second circuit element further comprises a synchronization detector generating a field synchronization signal having a first state during the field synchronization portion and a second state otherwise; and the adaptive gain control circuit is responsive to the sequence of symbol representative signals and the field synchronization signal to adjust the gain in response to the field synchronization portion.

15. The demodulator of claim 10 wherein:

the adaptive gain control circuit further comprises a slicer, responsive to the sequence of symbol representative signals for generating corresponding sequence of ideal symbol representative signals; and the adaptive gain control circuit is responsive to the sequence of symbol representative signals and the corresponding sequence of ideal symbol representative signals to adjust the gain.

16. The demodulator of claim 15 wherein the gain detector in the adaptive gain control circuit operates according to the equation $$y=x*(xs-x)$$

where y is a gain adjustment signal, x is a symbol representative signal and xs is an ideal symbol representative signal corresponding to x.

17. The demodulator of claim 15 wherein the gain detector in the adaptive gain control circuit operates according to the equation $$y=\mathrm{sign}(x)*(xs-x)$$

where y is a gain adjustment signal, x is a symbol representative signal, xs is an ideal symbol representative signal corresponding to x and sign (.) is the sign function.

* * * * *